United States Patent
Park et al.

(10) Patent No.: US 8,658,460 B2
(45) Date of Patent: Feb. 25, 2014

(54) ORGANIC LIGHT-EMITTING DISPLAY DEVICE AND METHOD OF MANUFACTURING THE SAME

(75) Inventors: Byoung-Keon Park, Yongin (KR); Tak-Young Lee, Yongin (KR); Jin-Wook Seo, Yongin (KR); Ki-Yong Lee, Yongin (KR); Heung-Yeol Na, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/368,536

(22) Filed: Feb. 8, 2012

(65) Prior Publication Data

US 2012/0326174 A1 Dec. 27, 2012

(30) Foreign Application Priority Data

Jun. 21, 2011 (KR) .................. 10-2011-0060230

(51) Int. Cl.
*H01L 51/40* (2006.01)
*H01L 21/00* (2006.01)

(52) U.S. Cl.
USPC .......... 438/99; 438/82; 438/88; 257/E21.507; 257/E21.619

(58) Field of Classification Search
USPC .............. 438/34, 99, 82, 88; 257/346, 388, 257/E21.507, E21.619
See application file for complete search history.

(56) References Cited

U.S. PATENT DOCUMENTS

| | | | |
|---|---|---|---|
| 6,414,738 B1 * | 7/2002 | Fujikawa | 349/147 |
| 6,562,671 B2 * | 5/2003 | Ohnuma | 438/160 |
| 6,706,544 B2 * | 3/2004 | Yamazaki et al. | 438/30 |
| 6,872,604 B2 * | 3/2005 | Yamazaki et al. | 438/151 |
| 7,235,850 B2 | 6/2007 | Koo et al. | |

(Continued)

FOREIGN PATENT DOCUMENTS

| KR | 10-2001-0090590 A | 10/2001 |
|---|---|---|
| KR | 10-2005-0050490 | 5/2005 |

(Continued)

OTHER PUBLICATIONS

A. Bonfiglietti, et al., Analysis of Electrical Characteristics of Gate Overlapped Lightly Doped Drain (GOLDD) Polysilicon Thin-Film Transistors With Different LDD Doping Concentration, IEEE Transactions on Electron Devices, vol. 50, No. 12, Dec. 2003, 9 pages.

*Primary Examiner* — Cheung Lee
*Assistant Examiner* — Jeremy Joy
(74) *Attorney, Agent, or Firm* — Christie, Parker & Hale, LLP

(57) ABSTRACT

A method of manufacturing an organic light-emitting display device includes forming a gate electrode including a lower gate electrode on a gate insulating layer and an upper gate electrode on the lower gate electrode; forming a source region and a drain region at a semiconductor active layer using the gate electrode as a mask; forming an interlayer insulating layer on a substrate and etching the interlayer insulating layer, resulting in contact holes that expose portions of the source region and the drain region; forming a source/drain electrode raw material on the substrate and etching the source/drain electrode raw material to form a source electrode and a drain electrode; forming a gold overlapped lightly doped drain (GOLDD) structure having a LDD region at the semiconductor active layer by injecting impurity ions; depositing a protective layer on the substrate; and forming a display device on the substrate.

12 Claims, 4 Drawing Sheets

(56) References Cited

U.S. PATENT DOCUMENTS

| | | | |
|---|---|---|---|
| 7,374,983 B2* | 5/2008 | Okamoto | 438/163 |
| 2002/0036288 A1* | 3/2002 | Ohnuma | 257/56 |
| 2004/0089878 A1* | 5/2004 | Takehashi et al. | 257/200 |
| 2004/0262608 A1* | 12/2004 | Kim et al. | 257/66 |
| 2005/0266595 A1 | 12/2005 | Lee | |
| 2006/0124933 A1* | 6/2006 | Kang | 257/59 |
| 2008/0157094 A1* | 7/2008 | Seo et al. | 257/72 |
| 2008/0164477 A1* | 7/2008 | Choi | 257/66 |

FOREIGN PATENT DOCUMENTS

| | | |
|---|---|---|
| KR | 10-2005-0082104 A | 8/2005 |
| KR | 10-2005-0100781 A | 10/2005 |
| KR | 10-2005-0104953 A | 11/2005 |

* cited by examiner

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2011-0060230, filed on Jun. 21, 2011, in the Korean Intellectual Property Office, the disclosure of which is incorporated herein in its entirety by reference.

BACKGROUND

1. Field

Aspects of embodiments according to the present invention relate to an organic light-emitting display device.

2. Description of Related Art

Organic light-emitting display devices (OLEDs) have been applied in electronic/electric products such as digital cameras, video cameras, camcorders, personal digital assistants (PDAs), smart phones, ultra-thin televisions, ultra-slim laptop computers, tablet personal computers, and flexible display devices.

Organic light-emitting display devices display images in color when holes and electrons, injected respectively from an anode and a cathode, recombine in an organic emission layer. An organic light-emitting display device has a stacked structure including an anode, a cathode, and an organic emission layer interposed between the anode and the cathode.

However, it is difficult to achieve high light-emission efficiency with such a structure, and thus additional intermediate layers, including an electron injection layer, an electron transport layer, a hole transport layer, a hole injection layer, etc., are optionally interposed between the organic emission layer and each of the electrodes.

Here, organic light-emitting display devices may be classified into passive matrix (PM) OLEDs and active matrix (AM) OLEDs according to a driving method. An AM OLED includes a thin film transistor (TFT) functioning as a switch. It is desirable to improve reliability and reduce leakage current property of polysilicon TFTs in an off state.

In order to improve reliability and reduce leakage current property of the TFTs, a lightly doped drain (LDD) structure has been used.

In a TFT having the LDD structure, a gate electrode is formed, and then low dose impurities are doped for forming the LDD structure. Then, high dose impurities are further doped by a photolithography process for forming a source region and a drain region of the TFT.

However, a TFT having the LDD structure has a reduced driving current and is made using more masks. Thus, yield is reduced and manufacturing costs are increased.

SUMMARY

Aspects of embodiments according to the present invention are directed toward an organic light-emitting display device having reduced driving current and excellent leakage current property by selectively forming a gate-overlapped lightly doped drain (GOLDD) structure in a TFT and a method of manufacturing the same.

According to an embodiment of the present invention, there is provided a method of manufacturing an organic light-emitting display device, the method including: forming a semiconductor active layer on a substrate; forming a gate insulating layer on the substrate and the semiconductor active layer; forming a gate electrode including a lower gate electrode on the gate insulating layer and an upper gate electrode on the lower gate electrode; forming a source region and a drain region at the semiconductor active layer using the gate electrode as a mask; forming an interlayer insulating layer 5 on the substrate and etching the interlayer insulating layer, resulting in contact holes that expose portions of the source region and the drain region; forming a source/drain electrode raw material on the substrate and etching the source/drain electrode raw material to form a source electrode and a drain electrode; forming a gate-overlapped lightly doped drain (GOLDD) structure having a lightly doped drain (LDD) region at the semiconductor 10 active layer by injecting impurity ions; depositing a protective layer on the substrate; and forming a display device on the substrate.

The interlayer insulating layer may be etched, edge portions of the upper gate electrode may be exposed when the interlayer insulating layer is etched.

When the source/drain electrode raw material is etched, the edge portions of the upper gate electrode may be etched concurrently (e.g., simultaneously) with the source/drain electrode raw material to expose edge portions of the lower gate electrode.

The length of the upper gate electrode may be shorter than that of the lower gate electrode.

After the source/drain electrode raw material is etched, the source electrode may be electrically connected to the source region, and the drain electrode may be electrically connected to the drain region, wherein the source electrode and the drain electrode may surround side walls of the gate insulating layer and the interlayer insulating layer, and portions of the contact holes may remain empty.

The forming of the GOLDD structure may include injecting impurity ions via edge portions of the lower gate electrode such that the LDD region having low impurity ion concentration may be formed at a portion of the semiconductor active layer vertically corresponding to the edge portions of the lower gate electrode.

The edge portions of the lower gate electrode and the LDD region having low impurity ion concentration may overlap each other.

The lower gate electrode may include a transparent conductive film.

The upper gate electrode may have a single-layered structure including one selected from the group consisting of Mo, MoW, Cr, Al, an Al alloy, Mg, Al, Ni, W, and Au, or a multi-layered structure including a mixture of Mo, MoW, Cr, Al, an Al alloy, Mg, Al, Ni, W, and Au.

According to another embodiment of the present invention, there is provided an organic light-emitting display device including: a semiconductor active layer on a substrate and having source/drain regions, a lightly doped drain (LDD) region, and a channel region; a gate insulating layer on the semiconductor active layer; a gate electrode including a lower gate electrode on the gate insulating layer and a upper gate electrode on the lower gate electrode; an interlayer insulating layer on the gate electrode and having contact holes; a source electrode and a drain electrode respectively electrically connected to the source/drain regions via the contact holes; a protective layer on the interlayer insulating layer; and a display device on the substrate, wherein a length of the upper gate electrode is shorter than that of the lower gate electrode so that edge portions of the lower gate electrode overlap the LDD region, and portions of the contact holes are filled with the source electrode and the drain electrode such that the side walls of the gate insulating layer and the interlayer insulating layer are surrounded, and a protective layer that covers the source electrode and the drain electrode is deposited in the other portions of the contact holes.

The concentration of doped impurity ions in different regions of the semiconductor active layer may be from relatively high to relatively low in the order of the source region and the drain region, the LDD region, and the channel region.

The lower gate electrode may include a transparent conductive film.

The upper gate electrode may have a single-layered structure including one selected from the group consisting of Mo, MoW, Cr, Al, an Al alloy, Mg, Al, Ni, W, and Au, or a multi-layered structure including a mixture of Mo, MoW, Cr, Al, an Al alloy, Mg, Al, Ni, W, and Au.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1A:
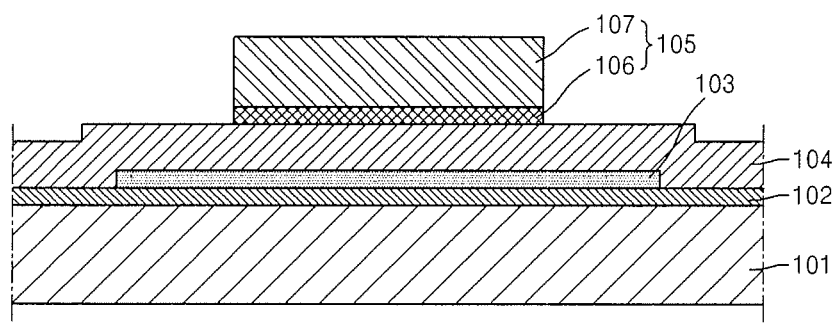
FIG. 1A is a cross-sectional view of a structure according to an embodiment of the present invention in which a semiconductor active layer, a gate insulating layer, and a gate electrode are formed on a substrate.

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof that are disclosed in the specification, and are not intended to preclude the possibility that one or more other features, numbers, steps, actions, components, parts, or combinations thereof may exist or may be added.

Hereinafter, an organic light-emitting display device according to an embodiment of the present invention will be described more fully with reference to the accompanying drawings, in which exemplary embodiments of the invention are shown. Like reference numerals in the drawings denote like elements, and thus their description will be omitted.

FIGS. 1A to 1H are diagrams for sequentially describing a method of manufacturing an organic light-emitting display device 100 according to an embodiment of the present invention.

Referring to FIG. 1A, a substrate 101 is prepared. The substrate 101 may be an insulating substrate such as a glass substrate or a plastic substrate.

A buffer layer 102 is formed on the substrate 101. The buffer layer 102 may have a structure including an organic material, an inorganic material, or both of the organic material and the inorganic material which are alternately stacked. The buffer layer 102 blocks oxygen and moisture, prevents moisture or impurities from being scattered from the substrate 101, or controls a heat transmission rate during the crystallization of a semiconductor active layer 103, resulting in assisting crystallization of the semiconductor.

Then, the semiconductor active layer 103 having a thickness of about 300 Å to about 700 Å is formed on the buffer layer 102. If polysilicon is used to form the semiconductor active layer 103, the semiconductor active layer 103 is formed by preparing amorphous silicon, crystallizing the amorphous silicon into polysilicon, and patterning the polysilicon.

The crystallization of the amorphous silicon may be performed by using various suitable methods such as rapid thermal annealing (RTA), solid phase crystallization (SPC), excimer laser annealing (ELA), metal induced crystallization (MIC), metal induced lateral crystallization (MILC), super grain silicon (SGS), or sequential lateral solidification (SLS).

Then, a gate insulating layer 104 is deposited on the semiconductor active layer 103 over the substrate 101. The gate insulating layer 104 may have a single-layered structure including $SiO_2$ or a double-layered structure including $SiO_2$ and $SiN_x$, and may have a total thickness of about 800 Å to about 1200 Å.

Then, a gate electrode 105 is formed on the gate insulating layer 104. The gate electrode 105 is deposited and patterned to have a double-layered structure including a lower gate electrode 106 and an upper gate electrode 107.

The lower gate electrode 106 may include a transparent conductive layer such as an ITO layer or an IZO layer, and the upper gate electrode 107 may include a material having selectivity ratio during etching. The upper gate electrode 107 may include one or more metals and may have a single-layered structure including Mo, MoW, Cr, Al, an Al alloy, Mg, Cu, Ti, Ag, Al, Ni, W, Au, or a multi-layered structure including any mixture thereof.

For example, the lower gate electrode 106 may be formed by depositing ITO to a thickness of about 300 Å, and the upper gate electrode 107 may be formed by depositing Mo/Al/Mo to a thickness of 1000/3000/1000 Å or 1000/4000/1000 Å.

Figure 1B:
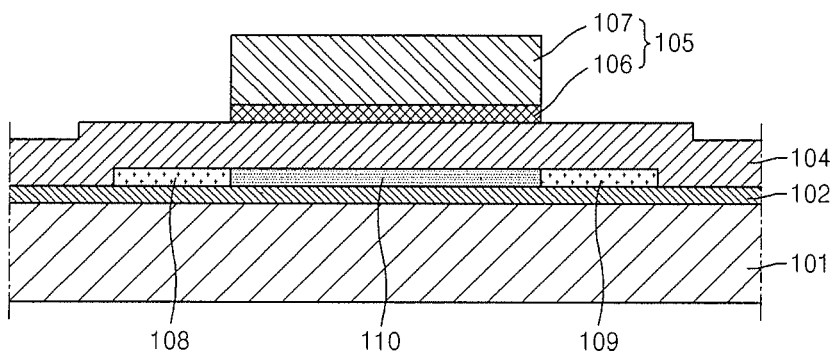
FIG. 1B is a cross-sectional view of a structure in which a source region and a drain region are formed on the semiconductor active layer of FIG. 1A.

Then, as shown in FIG. 1B, N-type or P-type impurity ions are doped on the semiconductor active layer 103 using the gate electrode 105 as a mask to form a source region 108 and a drain region 109. A region between the source region 108 and the drain region 109 on which the impurity is not doped is used as a channel region 110.

Figure 1C:
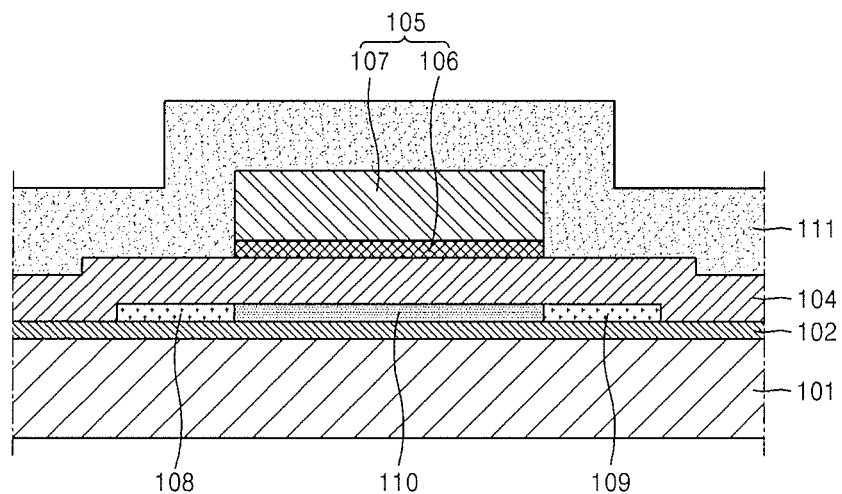
FIG. 1C is a cross-sectional view of a structure in which an interlayer insulating layer is formed on the substrate of FIG. 1A.

Then, an interlayer insulating layer 111 is formed over the substrate 101 as shown in FIG. 1C. The interlayer insulating layer 111 may have a single-layered structure including $SiO_2$ or a double-layered structure including $SiO_2$ and $SiN_x$. The total thickness of the interlayer insulating layer 111 is in the range of about 4000 Å to about 7000 Å.

Figure 1D:
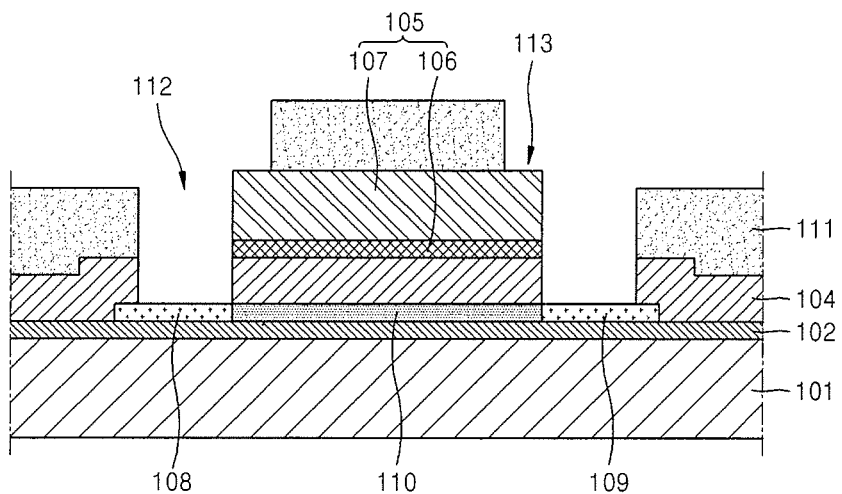
FIG. 1D is a cross-sectional view of a structure in which contact holes are formed in the substrate of FIG. 1C.

Then, as shown in FIG. 1D, the interlayer insulating layer 111 is etched to selectively remove the gate insulating layer 104 and the interlayer insulating layer 111, resulting in forming contact holes 112. By forming the contact holes 112, portions of the source region 108 and the drain region 109 are exposed.

Here, a portion of the upper gate electrode 107 is exposed. That is, when the interlayer insulating layer 111 is etched, edge portions 113 of the upper gate electrode 107 are not covered with the interlayer insulating layer 111 but exposed.

Accordingly, the interlayer insulating layer 111 is not formed in the contact holes 112.

Figure 1E:
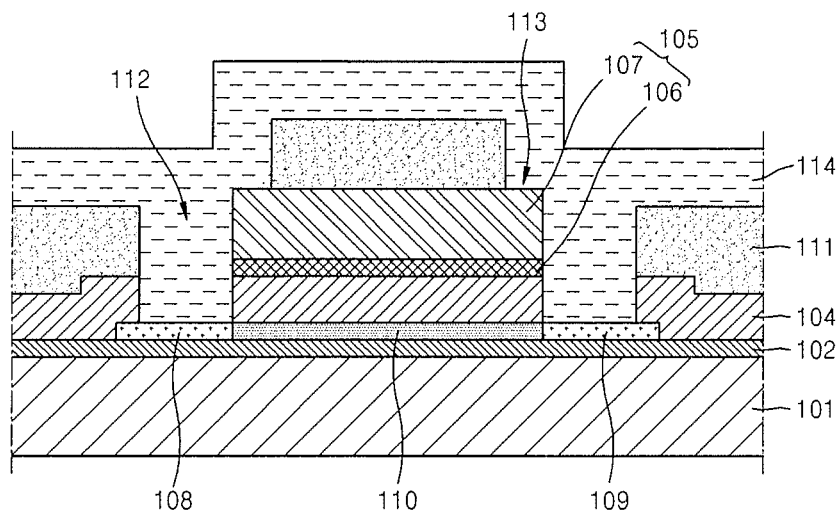
FIG. 1E is a cross-sectional view of a structure in which a source/drain electrode raw material is formed on the substrate of FIG. 1D.

Then, as shown in FIG. 1E, a source/drain metal raw material 114 is deposited over the substrate 101. The source/drain metal raw material 114 is deposited to have a Mo/Al/Mo structure, and the thickness of the structure is in the range of about 1000/4000 Å to about 6000/1000 Å. The source/drain metal raw material 114 is deposited such as to cover the contact holes 112, the interlayer insulating layer 111, and the edges 113 of the upper gate electrode 107.

Figure 1F:
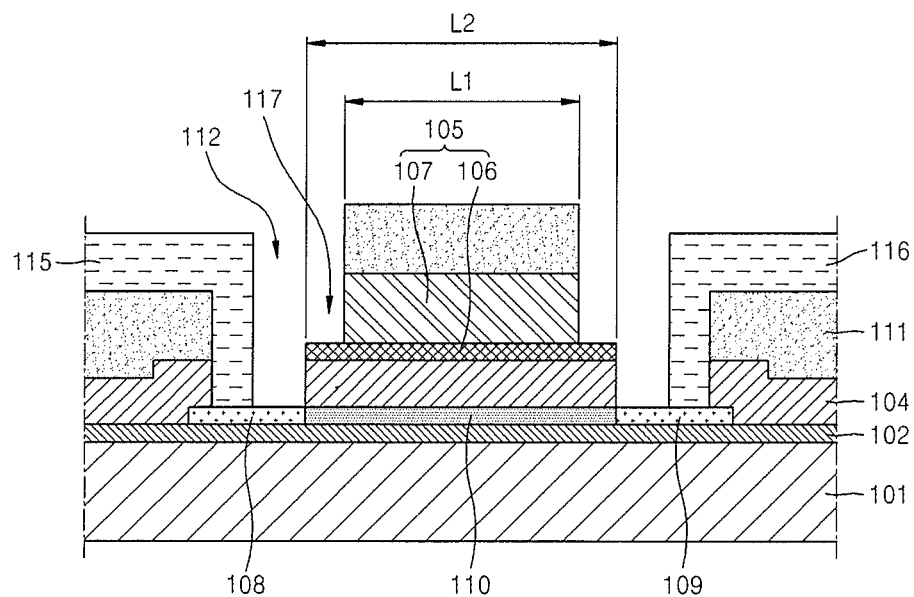
FIG. 1F is a cross-sectional view of a structure in which source/drain electrodes are formed on the substrate of FIG. 1E.

Then, a photoresist (not shown) is coated thereon, and the source/drain metal raw material 114 is etched. By etching the source/drain metal raw material 114, a source electrode 115 that is electrically connected to the source region 108 via the contact hole 112, and a drain electrode 116 that is electrically connected to the drain region 109 via the contact hole 112, are formed as shown in FIG. 1F.

In this regard, the source electrode 115 and the drain electrode 116 do not completely fill the entire contact holes 112. That is, one portion of the contact holes 112 is filled with the source electrode 115 and the drain electrode 116 such that the side walls of the stacked gate insulating layer 104 and the interlayer insulating layer 111 are surrounded by the source electrode 115 and the drain electrode 116, and the other portion of the contact hole 112 remains empty.

In particular, when the source/drain metal raw material (114 of FIG. 1E) is etched, the edge portions 113 (FIG. 1E) of the upper gate electrode 107 are etched concurrently (e.g., simultaneously) with the source/drain metal raw material 114 because the edge portions 113 of the upper gate electrode 107 are not covered with the interlayer insulating layer 111 and are exposed. Thus, the upper gate electrode 107 and the source/drain metal raw material 114 may be formed of the same material.

In this regard, an etchant that etches the edge portions 113 of the upper gate electrode 107 and the source/drain metal raw material 114, but does not etch the lower gate electrode 106, may be used. Accordingly, the edge portions 113 of the upper gate electrode 107 are etched so that edge portions 117 of the lower gate electrode 106 are exposed.

After the source/drain metal raw material 114 and the edge portions 113 of the upper gate electrode 107 are concurrently (e.g., simultaneously) etched, the length L1 of the upper gate electrode 107 is shorter than the length L2 of the lower gate electrode 106.

Figure 1G:
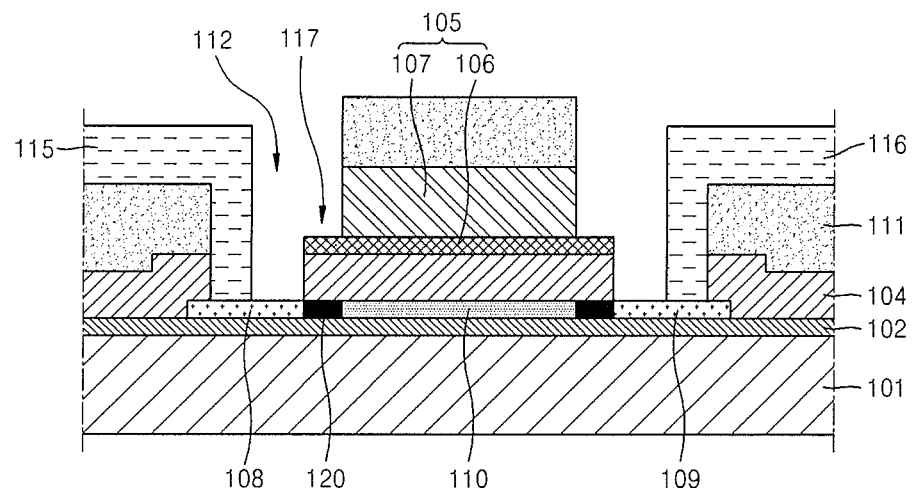
FIG. 1G is a cross-sectional view of a structure in which a GOLDD structure is formed on the substrate of FIG. 1F.

Then, as shown in FIG. 1G, lightly doped drain (LDD) regions 120 are formed by injecting N-type or P-type impurity ions such that the concentration of the dopant is less than that of the source region 108 and the drain region 109.

In other words, since the length L2 of the lower gate electrode 106 is greater than the length L1 of the upper gate electrode 107, the impurity ions are injected onto the semiconductor active layer via the edge portions 117 of the lower gate electrode 106 that extends out of the upper gate electrode 107 to form the LDD regions 120. Accordingly, the concentrations of the doped impurity ions in the different regions of the semiconductor active layer may range from relatively high to relatively low in the order of the source region 108 and the drain region 109, the LDD region 120, and the channel region 110.

As such, according to the current embodiment, a gold-overlapped lightly doped drain (GOLDD) structure in which the gate electrode 105 and the LDD region 120 overlap each other is formed. The GOLDD structure may be formed without using a mask since the length of the upper gate electrode 107 is shorter than that of the lower gate electrode 106 as described above.

Figure 1H:
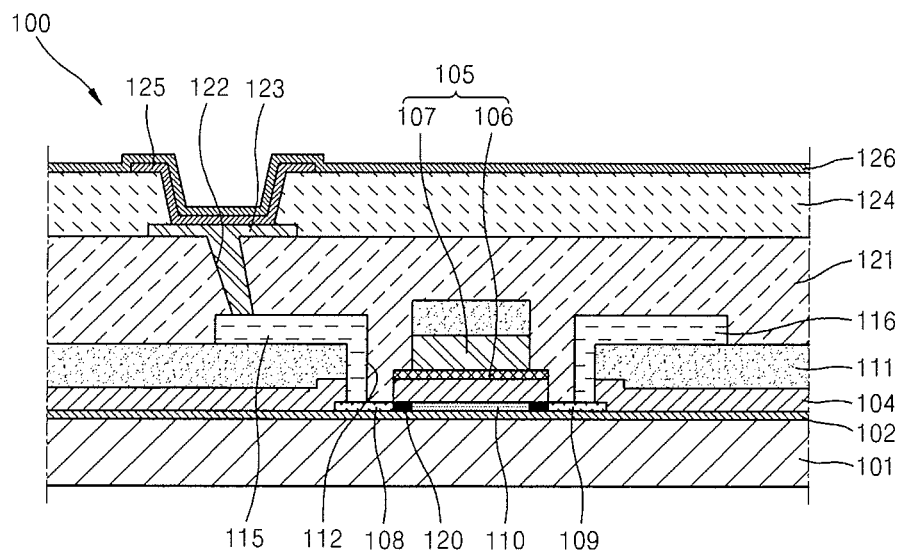
FIG. 1H is a cross-sectional view of a structure in which a display device is formed on the substrate of FIG. 1G.

Then, as shown in FIG. 1H, a display device is formed having a pixel unit in which the GOLDD structure is formed in a thin film transistor (TFT) unit. Each of the functional layers for forming the display device, for example, an anode of the pixel unit, may be concurrently (e.g., simultaneously) formed when the gate electrode 105 of the TFT unit is formed if a 5-mask process is applied thereto, or may be formed using a separate process for forming a thin layer. However, the method is not limited thereto.

Hereinafter, each of the functional layers of the display device formed using a separate process of forming a thin layer will be described. An organic light-emitting display device is described as the display device, but a variety of display devices may also be used without limitation.

A protective layer 121 is deposited over the substrate 101 on which the source electrode 115 and the drain electrode 116 are formed. The protective layer (e.g., a passivation layer and/or a planarization layer) 121 may include an organic material such as acryl, benzocyclobutene (BCB), and polyimide (PI) or an inorganic material such as $SiN_x$, and may have a single-layered structure or a multi-layered structure. Other modifications may also be applied thereto. Accordingly, the protective layer 121 covers the source electrode 115 and the drain electrode 116, and fills the remaining space of the contact hole 112, resulting in protecting the TFT.

Then, the protective layer 121 of the pixel unit is etched, and one of the source electrode 115 and the drain electrode 116 is electrically connected to the first electrode 123, which functions as an anode, via the contact hole 122.

The first electrode 123 is one of the electrodes of the organic light emitting display device and may include various conductive materials. The first electrode 123 may be a transparent electrode or a reflective electrode. The transparent electrode may be formed using ITO, IZO, ZnO, or $In_2O_3$, and the reflective electrode may be formed by forming a reflective layer using Ag, Mg, Al, Pt, Pd, Au, Ni, Nd, Ir, Cr, or any compound thereof, and forming ITO, IZO, ZnO, or $In_2O_3$ on the reflective layer.

Then, a pixel defining layer 124 is formed on the first electrode 123 by using an insulating material to expose at least one portion of the first electrode 123.

Then, an intermediate layer 125 including an emission layer is formed on the exposed portion of the first electrode 123. The intermediate layer 125 may be formed of a low molecular weight or high molecular weight organic material.

When the low molecular weight organic material is used, the intermediate layer 125 may be formed as a single-layered or multi-layered stacked structure including at least one layer selected from the group consisting of a hole injection layer (HIL), a hole transport layer (HTL), an emission layer (EML), an electron transport layer (ETL), and an electron injection layer (EIL).

If the low molecular weight organic material is used, various organic materials such as copper phthalocyanine (CuPc), N,N'-di(naphthalene-1-yl)-N,N'-diphenyl-benzidine (NPB), tris-8-hydroxyquinoline aluminum (Alq3), or the like may be used. These low molecular weight organic materials may be formed by vacuum deposition using masks.

When a high molecular weight organic material is used, the intermediate layer 125 may generally include the HTL and the EML. In this regard, the HTL may be formed using PEDOT, and the EML may be formed using poly-phenylenevinylene (PPV) and polyfluorene by screen printing or inkjet printing.

Then, a second electrode 126 that functions as a cathode is formed to face the first electrode 123 with the intermediate layer 125 therebetween.

The second electrode 126 may be a transparent electrode or a reflective electrode.

The transparent electrode may include a layer including Li, Ca, LiF/Ca, LiF/Al, Al, Mg, or any compound thereof, and an auxiliary electrode or a bus electrode line formed on the layer which is formed of a material used to form a transparent electrode such as ITO, IZO, ZnO, or $In_2O_3$. When the second electrode 126 is formed as a reflective electrode, Li, Ca, LiF/Ca, LiF/Al, Al, Ag, Mg, or a compound thereof is deposited on the entire surface of the second electrode 126.

An organic light-emitting display device 100 is prepared according to the method described above.

As described above, according to the organic light-emitting display device and the method of manufacturing the same according to embodiments of the present invention, hot carrier reliability or leakage current property of a TFT may be improved.

In addition, the GOLDD structure may be formed without using an additional mask during the 5-mask process, and thus manufacturing costs may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing an organic light-emitting display device, the method comprising:
   forming a semiconductor active layer on a substrate;
   forming a gate insulating layer on the substrate and the semiconductor active layer;
   forming a gate electrode comprising a lower gate electrode on the gate insulating layer and an upper gate electrode on the lower gate electrode;
   forming a source region and a drain region at the semiconductor active layer using the gate electrode as a mask;
   forming an interlayer insulating layer on the substrate and etching the interlayer insulating layer, resulting in contact holes that expose portions of the source region and the drain region;
   forming a source/drain electrode raw material on the substrate and etching the source/drain electrode raw material to form a source electrode and a drain electrode;
   after forming the source electrode and drain electrode, forming a gate-overlapped lightly doped drain (GOLDD) structure having a lightly doped drain (LDD) region at the semiconductor active layer by injecting impurity ions;
   depositing a protective layer on the substrate; and
   forming a display device on the substrate.

2. The method of claim 1, wherein when the interlayer insulating layer is etched, edge portions of the upper gate electrode are exposed.

3. The method of claim 2, wherein when the source/drain electrode raw material is etched, the edge portions of the upper gate electrode are etched concurrently with the source/drain electrode raw material to expose edge portions of the lower gate electrode.

4. The method of claim 3, wherein the length of the upper gate electrode is shorter than that of the lower gate electrode.

5. The method of claim 3, wherein after the source/drain electrode raw material is etched,
   the source electrode is electrically connected to the source region, and
   the drain electrode is electrically connected to the drain region,
   wherein the source electrode and the drain electrode surround side walls of the gate insulating layer and the interlayer insulating layer, and portions of the contact holes remain empty.

6. The method of claim 3, wherein the forming of the GOLDD structure comprises injecting impurity ions via the edge portions of the lower gate electrode such that the LDD region having low impurity ion concentration is formed at a portion of the semiconductor active layer vertically corresponding to the edge portions of the lower gate electrode.

7. The method of claim 6, wherein the edge portions of the lower gate electrode and the LDD region having low impurity ion concentration overlap each other.

8. The method of claim 1, wherein the lower gate electrode comprises a transparent conductive film.

9. The method of claim 1, wherein the upper gate electrode has a single-layered structure comprising one selected from the group consisting of Mo, MoW, Cr, Al, an Al alloy, Mg, Al, Ni, W, and Au, or a multi-layered structure comprising a mixture of Mo, MoW, Cr, Al, an Al alloy, Mg, Al, Ni, W, and Au.

10. The method of claim 1, further comprising forming a protective layer in the contact holes.

11. The method of claim 1, wherein the display device is an organic light-emitting device.

12. The method of claim 1, wherein when the source/drain electrode raw material is etched to form the source electrode and the drain electrode, portions of the source electrode and the drain electrode are left exposed.

* * * * *